United States Patent
Rouh et al.

(10) Patent No.: US 9,236,263 B2
(45) Date of Patent: Jan. 12, 2016

(54) METHOD FOR FABRICATING SEMICONDUCTOR DEVICE INCLUDING SILICON-CONTAINING LAYER AND METAL-CONTAINING LAYER, AND CONDUCTIVE STRUCTURE OF THE SAME

(71) Applicant: SK hynix Inc., Gyeonggi-do (KR)

(72) Inventors: Kyong-Bong Rouh, Gyeonggi-do (KR); Shang-Koon Na, Gyeonggi-do (KR); Yong-Seok Eun, Gyeonggi-do (KR); Su-Ho Kim, Gyeonggi-do (KR); Tae-Han Kim, Gyeonggi-do (KR); Mi-Ri Lee, Gyeonggi-do (KR)

(73) Assignee: SK Hynix Inc., Gyeonggi-Do (KR)

( * ) Notice: Subject to any disclaimer, the term of this patent is extended or adjusted under 35 U.S.C. 154(b) by 196 days.

(21) Appl. No.: 13/719,149

(22) Filed: Dec. 18, 2012

(65) Prior Publication Data
US 2014/0030884 A1    Jan. 30, 2014

(30) Foreign Application Priority Data
Jul. 26, 2012    (KR) .................. 10-2012-0081835

(51) Int. Cl.
| | |
|---|---|
| *H01L 21/3205* | (2006.01) |
| *H01L 21/4763* | (2006.01) |
| *H01L 21/283* | (2006.01) |
| *H01L 21/768* | (2006.01) |
| *H01L 21/3213* | (2006.01) |
| *H01L 21/28* | (2006.01) |
| *H01L 29/49* | (2006.01) |
| *H01L 27/108* | (2006.01) |

(52) U.S. Cl.
CPC ........ *H01L 21/283* (2013.01); *H01L 21/28061* (2013.01); *H01L 21/32136* (2013.01); *H01L 21/32137* (2013.01); *H01L 21/32139* (2013.01); *H01L 21/76841* (2013.01); *H01L 27/10885* (2013.01); *H01L 27/10888* (2013.01); *H01L 29/4941* (2013.01); *H01L 27/10876* (2013.01)

(58) Field of Classification Search
CPC .............. H01L 21/28061; H01L 21/32137; H01L 29/4491; H01L 21/283; H01L 21/32136; H01L 21/76841; H01L 27/10855; H01L 27/10888
USPC .................................................. 438/592, 653
See application file for complete search history.

(56) References Cited

U.S. PATENT DOCUMENTS

| | | | | |
|---|---|---|---|---|
| 6,362,086 | B2 * | 3/2002 | Weimer et al. ............... | 438/591 |
| 6,417,104 | B1 * | 7/2002 | Hu ............................... | 438/682 |
| 6,744,108 | B1 | 6/2004 | Pan | |
| 2002/0045342 | A1 * | 4/2002 | Hu et al. ...................... | 438/656 |
| 2006/0172550 | A1 * | 8/2006 | Chua ............................ | 438/770 |
| 2007/0034964 | A1 * | 2/2007 | Park et al. .................... | 257/369 |
| 2008/0230907 | A1 * | 9/2008 | Liu .................. H01L 21/76802 257/751 |  |

* cited by examiner

*Primary Examiner* — Long K Tran
(74) *Attorney, Agent, or Firm* — IP & T Group LLP

(57) ABSTRACT

A method for fabricating a semiconductor device includes forming a silicon-containing layer; forming a metal-containing layer over the silicon-containing layer; forming an undercut prevention layer between the silicon containing layer and the metal containing layer; etching the metal-containing layer; and forming a conductive structure by etching the undercut prevention layer and the silicon-containing layer.

8 Claims, 11 Drawing Sheets

METHOD FOR FABRICATING SEMICONDUCTOR DEVICE INCLUDING SILICON-CONTAINING LAYER AND METAL-CONTAINING LAYER, AND CONDUCTIVE STRUCTURE OF THE SAME

CROSS-REFERENCE TO RELATED APPLICATIONS

The present application claims priority of Korean Patent Application No. 10-2012-0081835, filed on Jul. 26, 2012, which is incorporated herein by reference in its entirety.

BACKGROUND

1. Field

Exemplary embodiments of the present invention relate to a semiconductor fabricating process, and more particularly, to a conductive structure including a silicon-containing layer and a metal-containing layer.

2. Description of the Related Art

Recently, semiconductor memory devices such as DRAM are operating at a high-speed. Therefore, a low-resistance material is used as the material of a gate electrode or a bit line. For example, when a metal-containing layer is formed as the material of the gate electrode or the bit line, it may be possible to implement a structure favorable to a high-speed operation. The metal-containing layer may include a stacked layer of two or more selected from titanium nitride (TiN), tungsten (W), tungsten nitride (WN), tungsten silicon nitride (WSiN), and tungsten silicide ($WSi_x$). Among the materials, TiN, WN, WSiN, or $WSi_x$ may serve as a diffusion barrier. For example, when a polysilicon layer and a tungsten layer are stacked, TiN, WN, WSiN, or $WSi_x$ may serve as a diffusion barrier between the polysilicon layer and the tungsten layer.

FIG. 1 is a diagram illustrating a gate structure formed by a conventional method.

Referring to FIG. 1, a gate dielectric layer 12 is formed over a semiconductor substrate 11. A silicon-containing layer 13 and a metal-containing layer are stacked over the gate dielectric layer 12. The metal-containing layer includes a diffusion barrier layer 14 and a metal layer 15.

A mask pattern 16 is formed over a metal layer 15, then by using the mask pattern 16 as an etch barrier, the metal-containing layer and the silicon-containing layer 13 are etched to form a gate structure.

In general, when the stacked structure of the silicon-containing layer 13 and the metal-containing layer is etched, a dry etch process such as reactive ion etching (RIE) is used. During the dry etch process, anisotropic etching must be performed for different kinds of materials.

During the etch process for the metal-containing layer, however, an undercut 17 may occur at the interface between the silicon-containing layer 13 and the metal-containing layer, because the silicon-containing layer 13 is more quickly etched. The undercut 17 occurs when the upper part of the silicon-containing layer 13 is etched. When the size of the undercut 17 further increases, the upper part of the silicon-containing layer 13 may be completely cut. Furthermore, when the undercut is severe, a part of the metal-containing layer may be lost (refer to reference numeral 18).

SUMMARY

Exemplary embodiments of the present invention are directed to a semiconductor structure capable of preventing an undercut of a lower material during an etch process for a metal-containing layer, and a method for fabricating a semiconductor device having the same.

In accordance with an embodiment of the present invention, a method for fabricating a semiconductor device includes forming a silicon-containing layer; forming a metal-containing layer over the silicon-containing layer; forming an undercut prevention layer between the silicon containing layer and the metal containing layer; etching the metal-containing layer; and forming a conductive structure by etching the undercut prevention layer and the silicon-containing layer.

In accordance with another embodiment of the present invention, a method for fabricating a semiconductor device includes forming an interlayer dielectric layer over a semiconductor substrate; forming a contact hole by etching the interlayer dielectric layer; forming a preliminary plug filling the contact hole, wherein the preliminary plug includes a silicon-containing layer and an undercut prevention layer formed over the silicon-containing layer; forming a metal-containing layer over the interlayer dielectric layer including the preliminary plug; and forming a bit line and a bit line contact plug by etching the metal-containing layer and the preliminary plug.

In accordance with yet another embodiment of the present invention, a method for fabricating a semiconductor device includes forming a first polysilicon layer; forming a tungsten-containing layer over the first polysilicon layer; forming a second polysilicon layer between the first polysilicon layer and the tungsten-containing layer, the second polysilicon layer containing at least one of carbon and nitrogen; etching the tungsten-containing layer; and etching the second polysilicon layer and the first polysilicon layer.

In accordance with still another embodiment of the present invention, a conductive structure of semiconductor device includes a first silicon-containing layer; a second silicon-containing layer formed over the first silicon-containing layer and containing at least one of carbon and nitrogen; and a tungsten-based metal-containing layer formed over the second silicon-containing layer.

DETAILED DESCRIPTION

Figure 1:
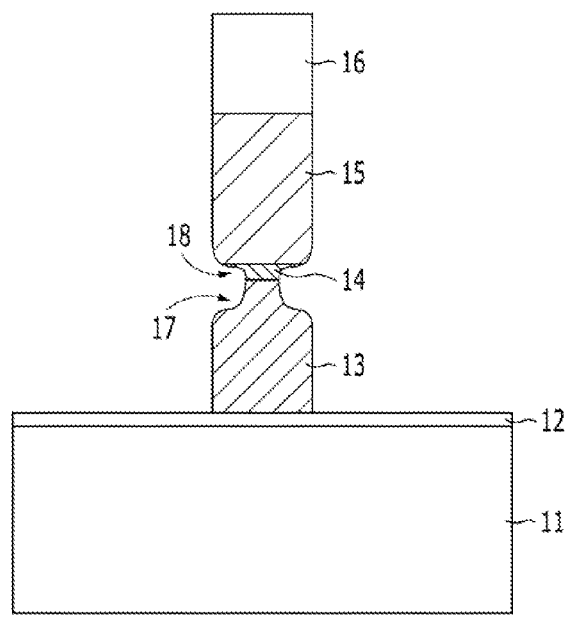
FIG. 1 is a diagram illustrating a gate structure formed by a conventional method.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

The embodiments of the present invention provide a structure capable of preventing an undercut of a silicon-containing layer formed under a metal-containing layer. For this structure, chemical species capable of controlling an etch rate are contained in the upper part of the silicon-containing layer. The silicon-containing layer containing chemical species has a low etch rate to prevent the undercut of silicon-containing layer. For example, the silicon-containing layer doped with chemical species such as carbon or nitrogen, which has a very low etch rate, may be used. When chemical species are selectively injected at a position where an undercut of the silicon-containing layer is expected and a general silicon-containing layer is formed under the position, it may be possible to prevent an undercut of the silicon-containing layer from occurring, regardless of how an etch process for the metal-containing layer is performed. The position where an undercut is expected may correspond to ½ or ⅓ of the entire thickness of the silicon-containing layer, and may correspond to an arbitrary lower position from an interface with the metal-containing layer.

The structure using chemical species capable of controlling an etch rate to prevent the undercut may be applied to a method for forming a semiconductor structure including a silicon-containing layer and a metal-containing layer. The semiconductor structure may include a gate electrode, a bit line contact plug, and/or a bit line.

FIGS. 2A to 2D are diagrams illustrating a method for forming a gate electrode in accordance with a first embodiment of the present invention.

Figure 2A:
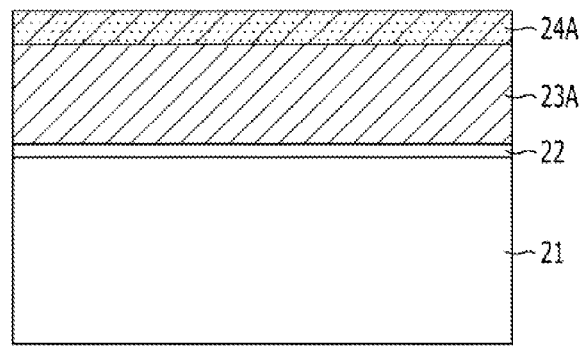
FIGS. 2A to 2D are diagrams illustrating a method for forming a gate electrode in accordance with a first embodiment of the present invention.

Referring to FIG. 2A, a semiconductor substrate 21 is prepared. The semiconductor substrate 21 may include an area where a transistor is to be formed. For example, the semiconductor substrate 21 may include an area where an NMOSFET is to be formed or an area where a PMOSFET is to be formed. Furthermore, the semiconductor substrate 21 may include both an area where an NMOSFET is to be formed and an area where a PMOSFET is to be formed. The semiconductor substrate 21 may include a substrate formed of silicon, germanium, or silicon germanium, and is not limited thereto. In addition, the entire or part of the semiconductor substrate 21 may be strained. Furthermore, although not illustrated, the semiconductor substrate 21 may include a well formed by a typical well formation process.

A gate dielectric layer 22 is formed over the semiconductor substrate 21. The gate dielectric layer 22 may include silicon oxide, silicon oxynitride, or a high-k material. When the gate dielectric layer 22 includes a high-k material, an interface layer (not shown) may be further formed between the semiconductor substrate 21 and the gate dielectric layer 22. The interface layer may include silicon oxide or silicon oxynitride. The high-k material has a larger dielectric constant than silicon oxide ($SiO_2$) having a dielectric constant of about 3.9. The high-k material has a larger physical thickness and a smaller equivalent oxide thickness (EOT) than $SiO_2$. The high-k material used as the gate dielectric layer 22 includes a metal-containing material such as a metal oxide, a metal silicate, or a metal silicate nitride. The metal oxide includes an oxide containing a metal such as hafnium (Hf), aluminum (Al), lanthanum (La), or zirconium (Zr). The metal oxide may include hafnium oxide ($HfO_2$), aluminum oxide ($Al_2O_3$), lanthanum oxide ($LaO_2$), zirconium oxide ($ZrO_2$) or a combination thereof. The metal silicate includes a silicate containing a metal such as Hf or Zr. For example, the metal silicate may include hafnium silicate (HfSiO), zirconium silicate ($ZrSiO_x$) or a combination thereof. The metal silicate nitride may be obtained by containing nitrogen into a metal silicate. The metal silicate nitride may include hafnium silicate nitride (HfSiON). The process for forming the gate dielectric layer 22 may include a deposition process suitable for a material to be deposited. For example, the formation process may include chemical vapor deposition (CVD), low-pressure CVD (LPCVD), plasma-enhanced CVD (PECVD), metal-organic CVD (MOCVD), atomic layer deposition (ALD), and plasma enhanced ALD (PEALD).

A silicon-containing layer 23A is formed over the gate dielectric layer 22. The silicon-containing layer 23A may include a polysilicon layer. The polysilicon layer may be doped with an impurity. The impurity may include an N-type or P-type impurity. The N-type impurity may include phosphorus or arsenic (As), and the P-type impurity may include boron. The polysilicon layer doped with an N-type impurity becomes an N-type polysilicon gate. The polysilicon layer doped with a P-type impurity becomes a P-type polysilicon gate. The silicon-containing layer 23A may be formed by CVD, ALD or the like. When the silicon-containing layer 23A is deposited, an N-type impurity or P-type impurity may be in-situ doped by using an impurity containing gas and a silicon source gas. Furthermore, the silicon-containing layer 23A may be formed in an undoped state, and then subsequently doped with an N-type impurity or P-type impurity.

An undercut prevention layer 24A is formed over the silicon-containing layer 23A. The undercut prevention layer 24A may have a thickness corresponding to an area where an undercut may occur during a subsequent dry etching process. The undercut prevention layer 24A may include a silicon-containing material. The undercut prevention layer 24A may be formed of the same material as the silicon-containing layer 23A. The undercut prevention layer 24A may include polysilicon. In this embodiment of the present invention, a material for preventing an undercut is contained into the undercut prevention layer 24A. That is, chemical species are injected into the undercut prevention layer 24A, thereby reducing an etch rate during a subsequent dry etch process. Accordingly, an undercut may be prevented. The chemical species contained in the undercut prevention layer 24A includes a material capable of controlling an etch rate. The chemical species may include carbon or nitrogen. In this case, carbon or nitrogen may be independently used as the chemical species, or carbon and nitrogen may be simultaneously used as the chemical species. Therefore, the undercut prevention layer 24A contains at least one of carbon and nitrogen. The undercut prevention layer 24A may include carbon-doped polysilicon, nitrogen-doped polysilicon, and carbon-nitrogen-doped polysilicon (SiCN). The undercut prevention layer 24A may be formed by in-situ doping chemical species when polysilicon is deposited or ion-implanting chemical species after polysilicon is deposited. To dope or ion-implant carbon or nitrogen, a carbon containing gas or nitrogen containing gas may be further used. The carbon containing gas may include $CH_4$, $CH_2$, $C_2H_2$ and the like. The nitrogen containing gas may include $NH_3$, $N_2$ and the like. The thickness of the undercut prevention layer 24A corresponds to a thickness at which an undercut may occur. For example, the undercut prevention layer 24A may have a thickness of about 100 to 300 Å.

Since the undercut prevention layer 24A containing chemical species is not etched even when the metal-containing layer 25A is etched, an undercut may not occur.

The undercut prevention layer 24A may further include an N-type impurity or P-type impurity in addition to the chemical species. Therefore, the silicon-containing layer 23A may include a polysilicon layer doped with a first impurity, and the undercut prevention layer 24A may include a polysilicon layer doped with a second impurity. Here, the first impurity may include an N-type impurity or P-type impurity, and the second impurity may include nitrogen, carbon, or a mixture of nitrogen and carbon. The polysilicon layer doped with the second impurity may further include an N-type impurity or P-type impurity implanted therein as the first impurity.

Figure 2B:
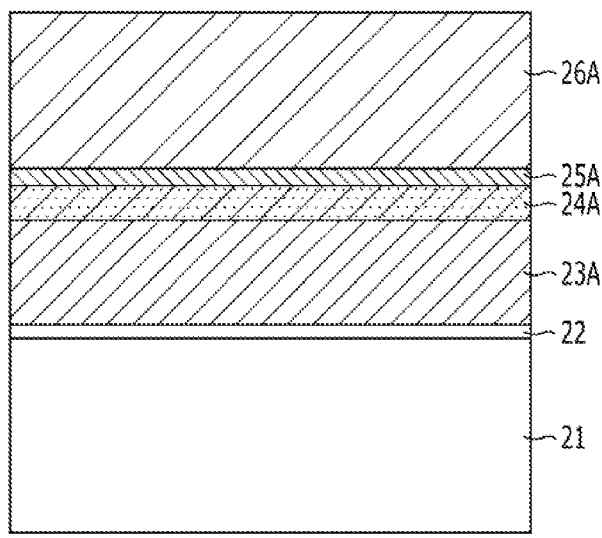

Referring to FIG. 2B, a metal-containing layer is formed over the undercut prevention layer 24A. The metal-containing layer may include a metal, a metal nitride, a metal silicide, and a metal silicon nitride. The metal-containing layer may include a stacked layer of two or more selected from a metal, a metal nitride, a metal silicide, and a metal silicon nitride. For example, the metal-containing layer may be formed by stacking tungsten silicide (WSi), tungsten nitride (WN), and tungsten (W). In another embodiment, the metal-containing layer may be formed by stacking WSi, tungsten silicon nitride (WSiN), and W. The metal-containing layer may include a diffusion barrier layer 25A and a metal layer 26A which are stacked therein. In this case, WSi, WN, and WSiN may be used as the diffusion barrier layer 25A for preventing a reaction between the silicon-containing layer 23A and the metal layer 26A.

Through the above-described series of processes, a gate stack is formed, in which the silicon-containing layer 23A, the undercut prevention layer 24A, the diffusion barrier layer 25A, and the metal layer 26A are stacked. When a tungsten-containing material is used as the diffusion barrier layer 25A and the metal layer 26A, low resistance may be obtained even though the thickness is reduced, and parasitic capacitance may be reduced. As a comparative example, a titanium-containing material may be used as the metal-containing layer. However, since the titanium-containing material has larger resistance than the tungsten-containing material, the titanium-containing material has a limitation in reducing resistance. Furthermore, when the tungsten-containing material is applied, the undercut prevention effect may be improved more compared to when the titanium-containing material is applied.

Figure 2C:
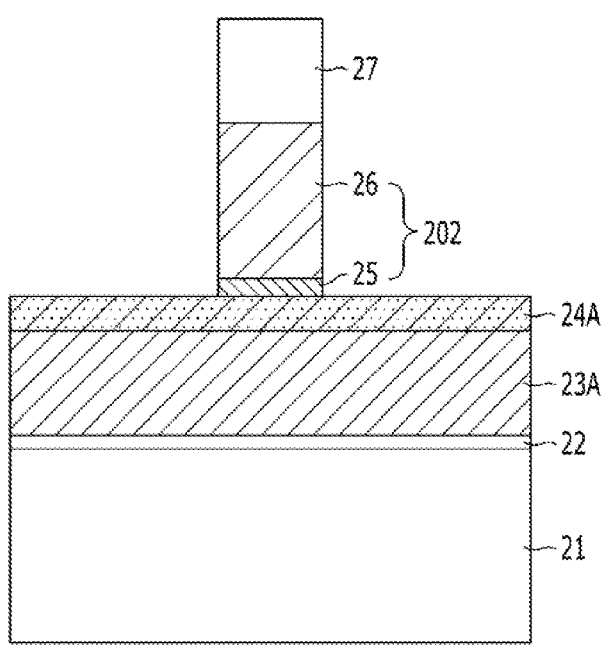

Referring to FIG. 2C, a mask pattern 27 is formed. The mask pattern 27 may include a material having a high etching selectivity with respect to the diffusion barrier layer 25A, the metal layer 26A, and the silicon-containing layer 23A. The mask pattern 27 may be formed of photoresist. Furthermore, the mask pattern 27 may include a patterned hard mask layer. The hard mask layer may include an insulation layer such as oxide or nitride.

Using the mask pattern 27 as an etch mask, the diffusion barrier layer 25A and the metal layer 26A forming the metal-containing layer are etched. Accordingly, a metal electrode 202 is formed. The metal electrode 202 may include a diffusion barrier layer pattern 25 and a metal layer pattern 26. The etch process for the metal-containing layer may include a dry etch process such as RIE. If the metal-containing layer is a tungsten-based layer, the etch process may be performed using $SF_6$, $Cl_2$, or a mixture of $SF_6$ and $Cl_2$. In addition to $SF_6$, a fluorine-based gas such as $NF_3$, $F_2$, HF or the like may be used. Furthermore, gases such as $N_2$ and $O_2$ may be further added during the etching process. As the above-described gases are used to etch the metal-containing layer, a vertical profile is formed. When the tungsten-based metal-containing layer is etched, a fluorine-based gas may be used as the main etching gas. Typically, the dry etch process includes a main etch process and an over etch process. The over etch process after the main etch process is performed in such a manner that residues of the etched material do not occur over the lower material.

During the above-described etch process, the etch rate of the metal-containing material is different from the etch rate of the silicon-containing material. For example, the undercut prevention layer 24A has a larger etch rate compared to the metal-containing layer. Therefore, an undercut may occur in the undercut prevention layer 24A. In this embodiment of the present invention, the undercut prevention layer 24A containing chemical species for reducing an etch rate to prevent an undercut is formed to reduce the etch rate. Accordingly, an undercut may be prevented in the undercut prevention layer 24A where an undercut is likely to occur during the etch process for the metal-containing layer. Furthermore, although the over etch process is sufficiently performed, an undercut may not occur. An undercut may occur in the diffusion barrier layer pattern 25 such as tungsten silicide among the materials used as the metal-containing layer. However, in this embodiment of the present invention, the undercut prevention layer 24A is formed to prevent a loss of the diffusion barrier layer pattern 25.

Figure 2D:
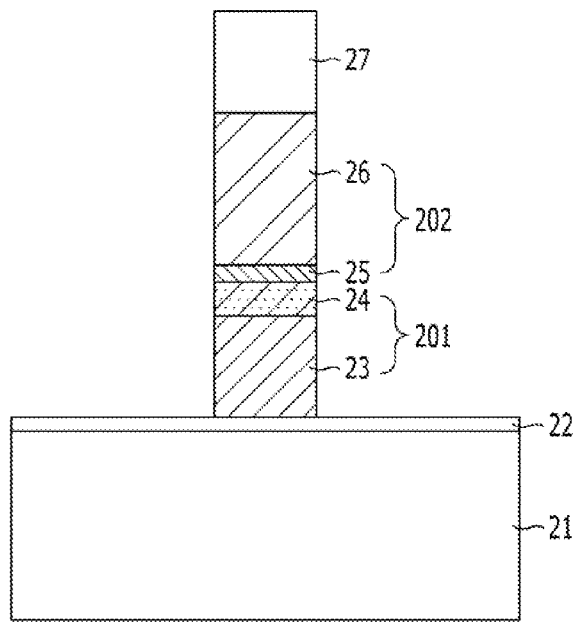

Referring to FIG. 2D, the undercut prevention layer 24A and the silicon-containing layer 23A are etched using the mask pattern 27 as an etch mask. Accordingly, a silicon electrode 201 is formed. The silicon electrode 201 may include a silicon-containing layer pattern 23 and an undercut prevention layer pattern 24. Therefore, the upper part of the silicon electrode 201 may have the undercut prevention layer pattern formed therein. The etch process for the undercut prevention layer 24A and the silicon-containing layer 23A may include a dry etch process such as RIE. For example, the etch process may be performed using $SF_6$, HBr, $Cl_2$, or a mixture thereof. In addition to $SF_6$, a fluorine-based gas such as $NF_3$, $F_2$, HF or the like may be used. Furthermore, gases such as $N_2$ and $O_2$ may be further added during the etch process. As the above-described gases are used to etch the undercut prevention layer 24A and the silicon-containing layer 23A, a vertical profile is formed. Since the undercut prevention layer 24A and the silicon-containing layer 23A include polysilicon, HBr may be used as the main etching gas. Typically, the dry etch process includes a main etch process and an over etch process. The over etch process performed after the main etch process is performed in such a manner that residues of the etched material do not occur over the lower material.

During the etch process for the silicon-containing layer 23A, an undercut may occur in the upper part of the silicon-containing layer 23A. In this embodiment of the present invention, the undercut prevention layer 24A containing chemical species for reducing a etch rate to prevent an undercut is formed over the silicon-containing layer so as to reduce the etch rate. Accordingly, although the over etch process is sufficiently performed, an undercut may not occur in the upper part of the silicon electrode 201. During the over etch process for the silicon-containing layer 23A, an undercut may occur in the diffusion barrier layer pattern 25 such as tungsten silicide among the materials used as the metal electrode 202. However, in this embodiment of the present invention, the undercut prevention layer pattern 24 is formed to prevent a loss of the diffusion barrier layer pattern 25.

As described above, when the silicon electrode 201 is formed, a gate electrode, which includes the silicon electrode 201 and the metal electrode 202 stacked therein, is formed over the gate dielectric layer 22. Between the silicon electrode 201 and the metal electrode 202, the undercut prevention layer pattern 24 is formed. The undercut prevention layer pattern 24 may function as the gate electrode as a part of the silicon electrode 201.

Subsequently, the mask pattern 27 is removed. When the mask pattern 27 includes a hard mask layer, the mask pattern 27 may be left. Furthermore, an ion implant process may be performed to form source and drain regions. Furthermore, a gate spacer is formed on sidewalls of the gate electrode. Before the gate spacer is formed, lightly-doped source and drain regions may be formed, and after the gate spacer is formed, high-concentration source and drain regions may be formed.

FIGS. 3A to 3E are diagrams illustrating a method for forming a gate electrode in accordance with a second embodiment of the present invention.

Figure 3A:
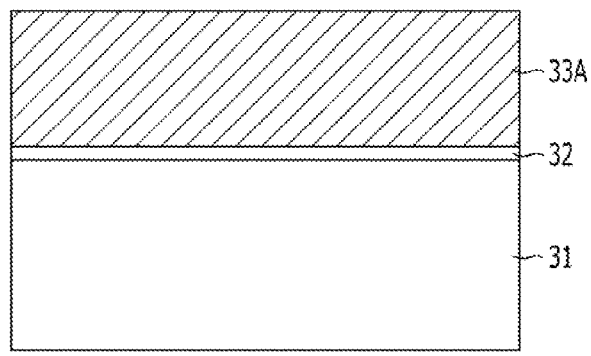
FIGS. 3A to 3E are diagrams illustrating a method for forming a gate electrode in accordance with a second embodiment of the present invention.

Referring to FIG. 3A, a semiconductor substrate 31 is prepared. The semiconductor substrate 31 may include an area where a transistor is to be formed. For example, the semiconductor substrate 31 may include an area where an NMOSFET is to be formed or an area where a PMOSFET is to be formed. Furthermore, the semiconductor substrate 31 may include both an area where an NMOSFET is to be formed and an area where a PMOSFET is to be formed. The semiconductor substrate 31 may include a substrate formed of silicon, germanium, or silicon germanium, and is not limited thereto. Furthermore, the entire or part of the semiconductor substrate 31 may be strained. Furthermore, although not illustrated, the semiconductor substrate 31 may include a well formed by a typical well formation process.

A gate dielectric layer 32 is formed over the semiconductor substrate 31. The gate dielectric layer 32 may include silicon oxide, silicon oxynitride, or a high-k material. When the gate dielectric layer 32 includes a high-k material, an interface layer may be further formed between the semiconductor substrate 31 and the gate dielectric layer 32. The interface layer may include silicon oxide or silicon oxynitride. The high-k material has a larger dielectric constant than silicon oxide ($SiO_2$) having a dielectric constant of about 3.9. Furthermore, the high-k material has a larger physical thickness and a smaller EOT than $SiO_2$. The high-k material used as the gate dielectric layer 32 includes a metal-containing material such as a metal oxide, a metal silicate, or a metal silicate nitride. The metal oxide includes an oxide containing a metal such as Hf, Al, La, or Zr. The metal oxide may include $HfO_2$, $Al_2O_3$, $LaO_2$, $ZrO_2$ or a combination thereof. The metal silicate includes a silicate containing a metal such as Hf or Zr. The metal silicate may include HfSiO, $ZrSiO_x$, or a combination thereof. The metal silicate nitride may be obtained by incorporating nitrogen into a metal silicate. The metal silicate nitride may include HfSiON. The process for forming the gate dielectric layer 32 may include a suitable deposition process for a material to be deposited. For example, the formation process may include CVD, LPCVD, PECVD, MOCVD, ALD, and PEALD.

A silicon-containing layer 33A is formed over the gate dielectric layer 32. The silicon-containing layer 33A may include a polysilicon layer. The polysilicon layer may be doped with an impurity. The impurity may include an N-type or P-type impurity. The N-type impurity may include phosphorus or As, and the P-type impurity may include boron. The polysilicon layer doped with an N-type impurity becomes an N-type polysilicon gate. The polysilicon layer doped with a P-type impurity becomes a P-type polysilicon gate. The silicon-containing layer 33A may be formed by CVD, ALD or the like. When the silicon-containing layer 33A is deposited, an N-type impurity or P-type impurity may be in-situ doped using an impurity containing gas and a silicon source gas. Furthermore, the silicon-containing layer 33A may be formed in an undoped state, and then subsequently doped with an N-type impurity or P-type impurity through an ion implant process.

Figure 3B:
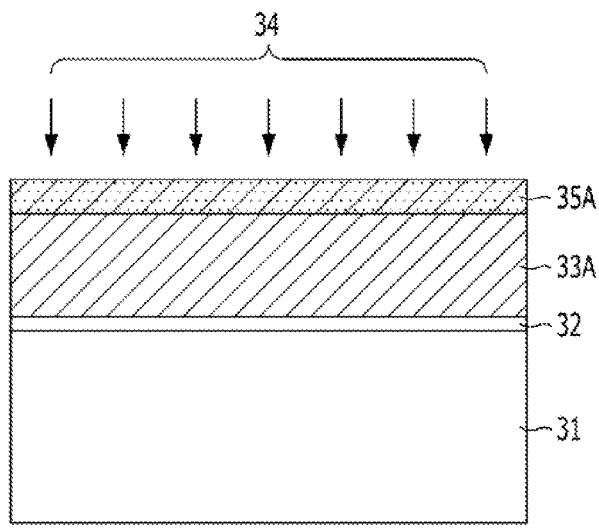

Referring to FIG. 3B, an undercut prevention layer 35A is formed in the upper part of the silicon-containing layer 33A. The undercut prevention layer 35A may have a thickness corresponding to an area where an undercut may occur during a subsequent dry etch process. To form the undercut prevention layer 35A, chemical species injection may be performed. Through the chemical species injection, chemical species are doped or implanted into the upper part of the silicon-containing layer 33A. Accordingly, the undercut prevention layer 35A containing the chemical species is formed. The undercut prevention layer 35A may include the same material as the silicon-containing layer 33A. That is, the undercut prevention layer 35A may include a silicon-containing material. The undercut prevention layer 35A may include polysilicon. In this embodiment of the present invention, a material for preventing an undercut is injected into the undercut prevention layer 35A. That is, the chemical species are contained in the undercut prevention layer 35A to reduce the etch rate during the subsequent dry etch process. Accordingly, an undercut may be prevented. The chemical species injected into the undercut prevention layer 35A include a material capable of controlling the etch rate. The chemical species may include carbon or nitrogen. In this case, carbon or nitrogen may be independently used as the chemical species, or carbon and nitrogen may be simultaneously used as the chemical species. Therefore, the undercut prevention layer 35A may include at least one of carbon and nitrogen. The undercut prevention layer 35A may include carbon-doped polysilicon, nitrogen-doped polysilicon, and carbon-nitrogen-doped polysilicon (SiCN).

The chemical species injection 34 may include doping and ion implantation. Furthermore, the chemical species injection 34 may include a heat treatment or plasma treatment in an atmosphere including at least one of carbon and nitrogen. To inject at least one of carbon and nitrogen, at least one of a carbon containing gas and nitrogen containing gas may be used. The carbon containing gas may include $CH_4$, $CH_2$, $C_2H_2$ and the like. The nitrogen containing gas may include $NH_3$, $N_2$ and the like.

The thickness of the undercut prevention layer 35A corresponds to a thickness at which an undercut may occur. For example, the undercut prevention layer 35A may have a thickness of about 100 to 300 Å.

Since the undercut prevention layer 35A having the species injected therein is not etched even when the metal-containing layer 36A is etched, an undercut may not occur.

The undercut prevention layer 35A may further include an N-type or P-type impurity other than the chemical species. Therefore, the silicon-containing layer 33A may include a polysilicon layer doped with a first impurity, and the undercut prevention layer 36A may include a polysilicon layer doped with a second impurity. Here, the first impurity may include an N-type or P-type impurity, and the second impurity may include nitrogen, carbon, or a mixture of nitrogen and carbon. The polysilicon layer doped with the second impurity may further include an N-type or P-type impurity implanted therein as the first impurity.

Figure 3C:
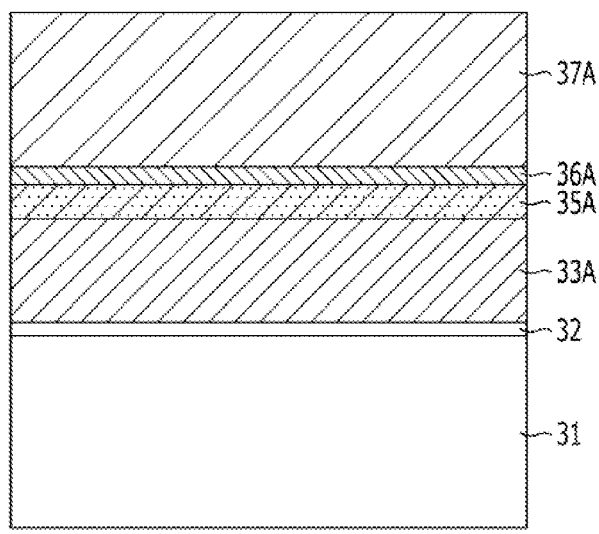

Referring to FIG. 3C, a metal-containing layer is formed over the undercut prevention layer 35A. The metal-containing layer may include a metal, a metal nitride, a metal silicide, and a metal silicon nitride. The metal-containing layer may include a stacked layer of two or more selected from a metal, a metal nitride, a metal silicide, and a metal silicon nitride. For example, the metal-containing layer may be formed by stacking tungsten silicide, tungsten nitride, and tungsten. In another embodiment, the metal-containing layer may be formed by stacking tungsten silicide, tungsten nitride, and tungsten. The metal-containing layer may include a diffusion barrier layer 36A and a metal layer 37A, which are stacked therein. In this case, tungsten silicide, tungsten nitride, and tungsten silicon nitride may be used as the diffusion barrier layer 36A for preventing a reaction between the silicon-containing layer 33A and the metal layer 37A.

Through the above-described series of processes, a gate stack is formed, in which the silicon-containing layer 33A, the undercut prevention layer 35A, the diffusion barrier layer 36A, and the metal layer 37A are stacked.

Figure 3D:
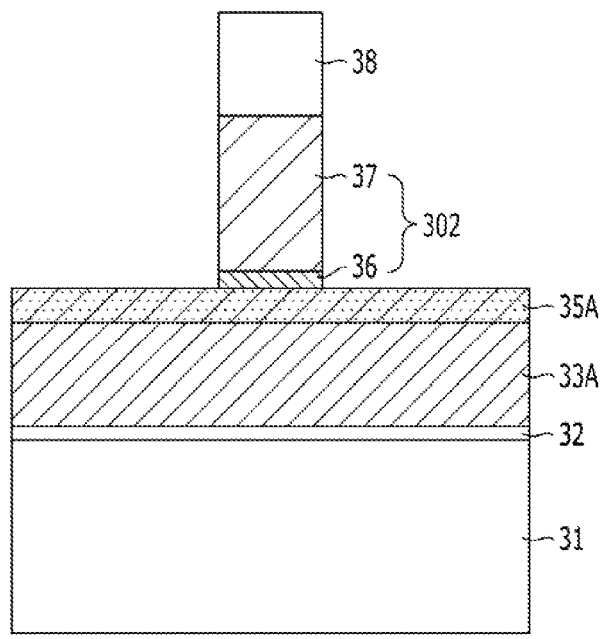

Referring to FIG. 3D, a mask pattern 38 is formed. The mask pattern 38 may be formed of photoresist. Furthermore, the mask pattern 38 may include a patterned hard mask layer. The hard mask layer may include an insulation layer such as oxide or nitride.

Using the mask pattern 38 as an etch mask, the metal layer 37A and the diffusion barrier layer 36A forming the metal-containing layer are etched. Accordingly, a metal electrode 302 is formed. The metal electrode 302 may include a diffusion barrier layer pattern 36 and a metal layer pattern 37. The etch process for the metal-containing layer may include a dry etch process such as RIE. If the metal-containing layer is tungsten-based layer, the etch process may be performed using $SF_6$, $Cl_2$, or a mixture of $SF_6$ and $Cl_2$. In addition to $SF_6$, a fluorine-based gas such as $NF_3$, $F_2$, HF or the like may be used. Furthermore, gases such as $N_2$ and $O_2$ may be further added during the etch process. As the above-described gases are used to etch the metal-containing layer, a vertical profile is formed. When the tungsten-based metal-containing layer is etched, a fluorine-based gas may be used as the main etching gas. Typically, the dry etch process includes a main etch process and an over etch process. The over etch process after the main etch process is performed in such a manner that residues of the etched material do not occur over the lower material.

During the above-described etch process, the etch rate of the metal-containing material is different from the etch rate of the silicon-containing material. For example, the silicon-containing layer 33A has a larger etch rate compared to the metal-containing layer. Therefore, an undercut may occur in the upper part of the silicon-containing layer 33A. In this embodiment of the present invention, the undercut prevention layer 35A containing chemical species for reducing an etch rate to prevent an undercut is formed over the silicon-containing layer 33A to reduce the etch rate. Accordingly, an undercut may not occur in the undercut prevention layer 35A where an undercut is likely to occur during the etch process for the metal-containing layer. Furthermore, although the over etch process is sufficiently performed, an undercut may not occur. An undercut may occur in the diffusion barrier layer pattern 36 such as tungsten silicide among the materials used as the metal-containing layer. However, in this embodiment of the present invention, the undercut prevention layer 35A is formed to prevent a loss of the diffusion barrier layer pattern 36.

Figure 3E:
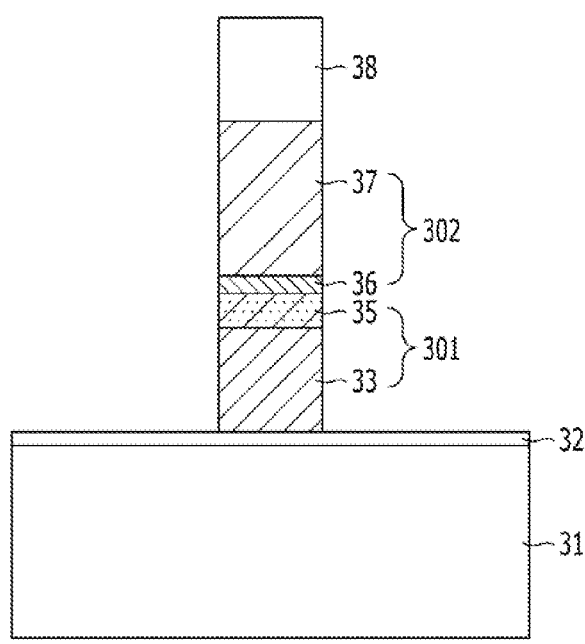

Referring to FIG. 3E, the undercut prevention layer 24A and the silicon-containing layer 23A are etched by using the mask pattern 38 as an etch mask. Accordingly, a silicon electrode 301 is formed. The silicon electrode 301 may include a silicon-containing layer pattern 33 and an undercut prevention layer pattern 35. Therefore, the upper part of the silicon electrode 301 may have the undercut prevention layer pattern 35 formed therein. The etch process for the undercut prevention layer 35A and the silicon-containing layer 33A may include a dry etch process such as RIE. For example, the etch process may be performed using $SF_6$, HBr, $Cl_2$, or a mixture thereof. In addition to $SF_6$, a fluorine-based gas such as $NF_3$, $F_2$, HF or the like may be used. Furthermore, gases such as $N_2$ and $O_2$ may be further added during the etch process. As the above-described gases are used to etch the undercut prevention layer 35A and the silicon-containing layer 33A, a vertical profile is formed. Since the undercut prevention layer 35A and the silicon-containing layer 33A include polysilicon, HBr may be used as the main etch gas. Typically, the dry etch process includes a main etch process and an over etch process. The over etch process performed after the main etch process is performed in such a manner that residues of the etched material do not occur over the lower material.

During the etch process for the silicon-containing layer 33A, an undercut may occur in the undercut prevention layer pattern 35. In this embodiment of the present invention, the undercut prevention layer pattern 35 containing chemical species for reducing an etch rate to prevent an undercut is formed over the silicon-containing layer 33A to reduce the etch rate. Accordingly, although the over etch process is sufficiently performed, an undercut may not occur in the upper part of the silicon electrode 301. During the over etch process for the silicon-containing layer 33A, an undercut may occur in the diffusion barrier layer pattern 36 such as tungsten silicide among the materials used as the metal electrode 302. However, in this embodiment of the present invention, the undercut prevention layer pattern 35 is formed to prevent a loss of the diffusion barrier layer pattern 36.

When the silicon electrode 301 is formed as described above, a gate electrode having the silicon electrode 301 and the metal electrode 302 stacked therein is formed over the gate dielectric layer 32. Between the silicon electrode 301 and the metal electrode 302, the undercut prevention layer pattern 35 is formed. The undercut prevention layer pattern 35 may function as the gate electrode as a pat of the silicon electrode 301.

Subsequently, the mask pattern 38 is removed. When the mask pattern 38 includes a hard mask layer, the mask pattern 38 may be left. Furthermore, an ion implantation process may be performed to form a source and drain regions. Furthermore, a gate spacer is formed on both sidewalls of the gate electrode. Before the gate spacer is formed, lightly-doped source and drain regions may be formed, and after the gate spacer is formed, high-concentration source and drain regions may be formed.

In accordance with the first and second embodiments of the present invention, when the gate electrode is formed, the undercut prevention layer into which the chemical species such as carbon and nitrogen are injected is formed prior to an undercut in the upper part of the silicon-containing layer where an undercut is likely to occur. Therefore, it may be possible to prevent an undercut during the etch process of the metal-containing layer.

Hereafter, a method for forming a bit line in accordance with a third embodiment of the present invention will be described.

FIGS. 4A to 4I are diagrams illustrating a method for forming a bit line in accordance with a third embodiment of the present invention.

Figure 4A:
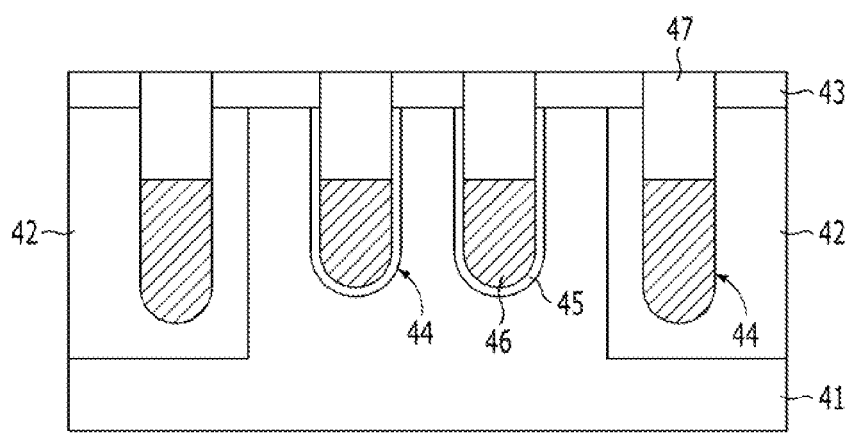
FIGS. 4A to 4I are diagrams illustrating a method for forming a bit line in accordance with a third embodiment of the present invention.

Referring to FIG. 4A, an isolation layer 42 is formed to define an active region in a semiconductor substrate 41. Using a hard mask layer pattern 43 as an etch mask, the semiconductor substrate 41 is etched to form a gate trench 44. A gate dielectric layer 45 is formed on the surface of the gate trench 44. Then, a buried gate 46 is formed over the gate dielectric layer 45 so as to partially fill the gate trench 44. The buried gate 46 may include a metal layer. The buried gate 46 is formed by the following process: a metal layer is deposited on the entire surface of the resultant structure so as to fill the gate trench 44, and then a chemical mechanical polishing (CMP) process and an etch back process are sequentially performed. Accordingly, the buried gate 46 is formed to partially fill the gate trench 45.

A capping layer 47 is formed over the buried gate 46. The capping layer 47 may include nitride. The capping layer 47 serves to protect the buried gate 46. The capping layer 47 may be formed by depositing nitride on the semiconductor substrate 41 including the buried gate 46 and performing an etch back process. Accordingly, the capping layer 47 is formed to fill the space over the buried gate 46. In another embodiment, the capping layer 47 may be formed on the entire surface of the semiconductor substrate 41 to fill the space over the buried gate 46. Furthermore, in another embodiment, a sealing layer may be further formed on the entire surface of the semiconductor substrate including the capping layer 47. The sealing layer may include nitride.

Figure 4B:
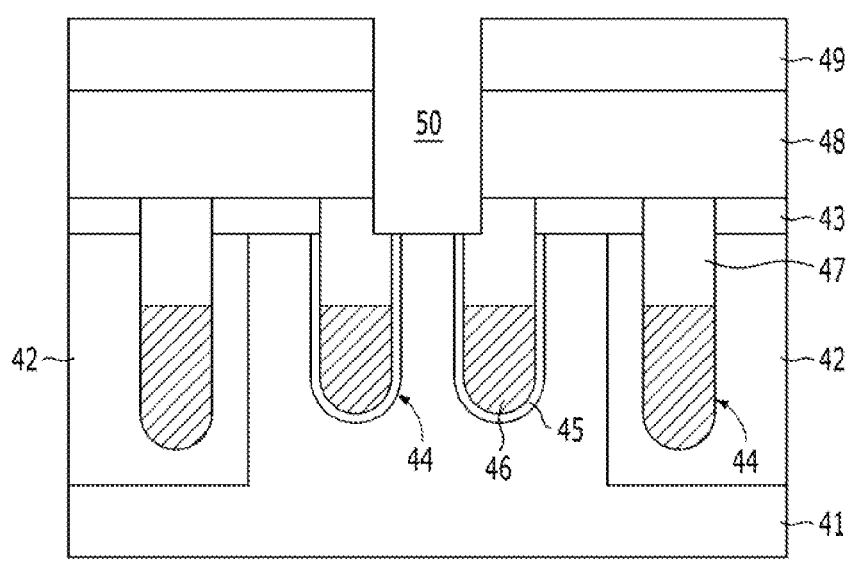

Referring to FIG. 4B, an interlayer dielectric layer 48 is formed on the entire surface of the resultant structure including the capping layer 47. The Interlayer dielectric layer 48 may include oxide such as boron phosphorus silicate glass (BPSG). A first mask pattern 49 is formed over the interlayer dielectric layer 48. Here, the first mask pattern 49 may define a hole. The first mask pattern 49 may be formed using a photoresist layer or hard mask layer.

The interlayer dielectric layer 48 and the hard mask layer pattern 43 are etched using the first mask pattern 49 as an etch mask. Accordingly, a bit line contact hole 50 is formed. As the hard mask layer pattern 43 is removed, the surface of the semiconductor substrate 41 to be contacted with a bit line is partially exposed.

Figure 4C:
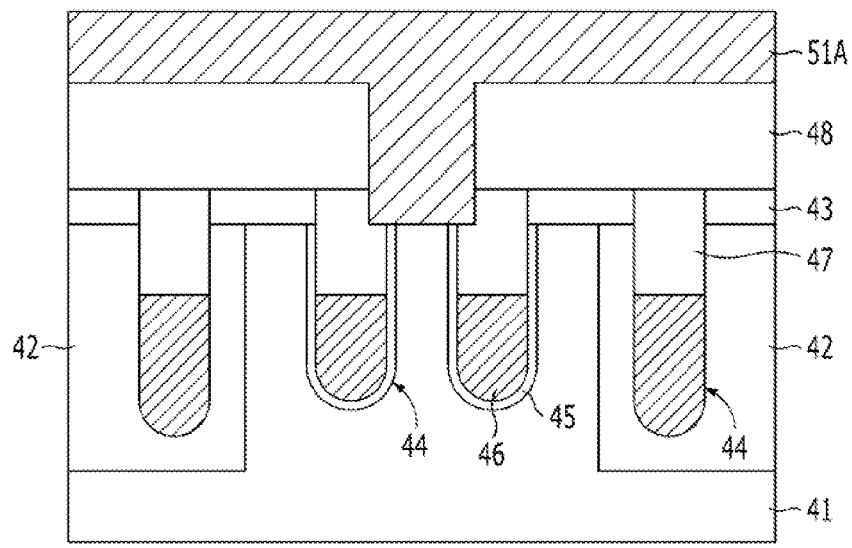

Referring to FIG. 4C, the first mask pattern 48 is removed. Although not illustrated, a spacer may be formed on the sidewalls of the bit line contact hole 50. The spacer may include oxide, nitride, or a stacked structure thereof.

Until the bit line contact hole 50 is filled, a silicon-containing layer 51A is formed on the entire surface of the resultant structure. The silicon-containing layer 51A may include a polysilicon layer. The polysilicon layer may be undoped or doped with an impurity. The impurity may include an N-type or P-type impurity. The N-type impurity may include phosphorous or As. The P-type impurity may include boron. The silicon-containing layer 51A may be formed by CVD, ALD or the like. When the silicon-containing layer 51A is deposited, an N-type or P-type impurity may be in-situ doped using an impurity containing gas and a silicon source gas. Furthermore, after the silicon-containing layer 51A is formed in an undoped state, ion implantation may be used to dope an N-type or P-type impurity.

Figure 4D:
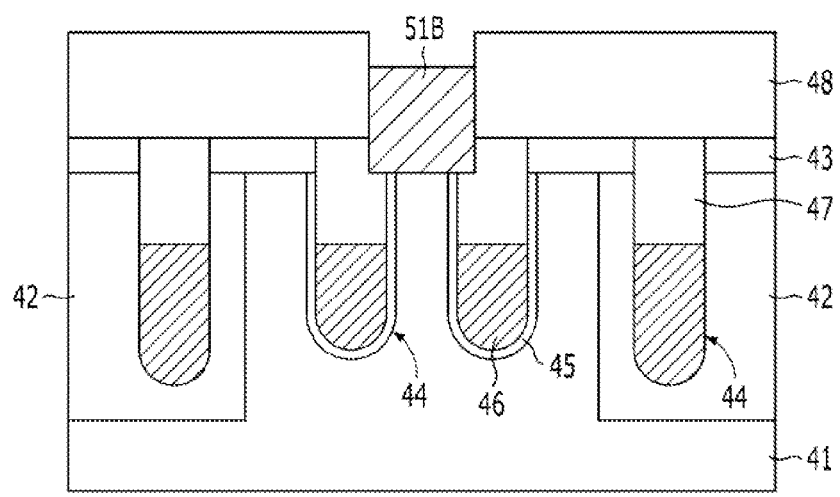

Referring to FIG. 4D, the silicon-containing layer 51A is selectively removed to form a silicon-containing layer pattern 51B to fill the bit line contact hole. To form the silicon-containing layer pattern 51B, a CMP or etch back process may be performed. The surface of the silicon-containing layer pattern 51B may be recessed more than the surface of the interlayer dielectric layer 48.

Figure 4E:
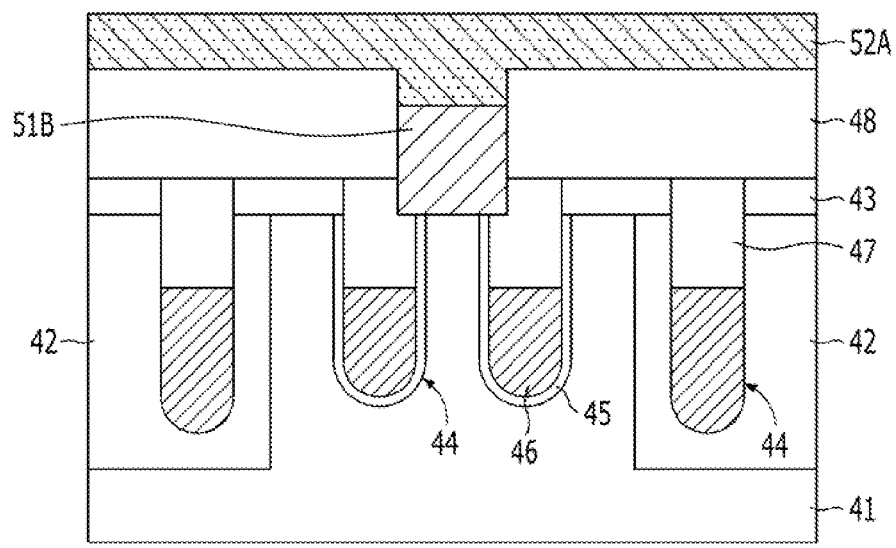

Referring to FIG. 4E, an undercut prevention layer 52A is formed on the entire surface of the resultant structure including the silicon-containing layer pattern 51B. The undercut prevention layer 52A may have a thickness corresponding to an area where an undercut is likely to occur during a subsequent dry etch process. The undercut prevention layer 52A may be formed of the same material as the silicon-containing layer 51A. For example, the undercut prevention layer 52A may include a silicon-containing material. The undercut prevention layer 52A may include polysilicon. In this embodiment of the present invention, a material for preventing an undercut is contained into the undercut prevention layer 52A. That is, chemical species are contained in the undercut prevention layer 52A to reduce an etch rate during a subsequent dry etch process. Accordingly, an undercut may be prevented. The chemical species contained in the undercut prevention layer 52A may include a material capable of controlling the etch rate. The chemical species may include carbon or nitrogen. In this case, carbon and nitrogen may be independently or simultaneously used as the species. Therefore, the undercut prevention layer 52A may contain at least one of carbon and nitrogen. The undercut prevention layer 52A may include carbon-doped polysilicon, nitrogen-doped polysilicon, and carbon-nitrogen-doped polysilicon (SiCN). The undercut prevention layer 52A may be formed by in-situ doping chemical species when polysilicon is deposited or ion-implanting chemical species after polysilicon is deposited. To dope or ion-implant carbon or nitride, a carbon containing gas or nitrogen containing gas may be further used. The carbon containing gas may include $CH_4$, $CH_2$, $C_2H_2$ and the like. The nitrogen containing gas may include $NH_3$, $N_2$ and the like. The thickness of the undercut prevention layer 52A corresponds to a thickness at which an undercut may occur. For example, the undercut prevention layer 52A may have a thickness of about 100 to 300 Å.

Since the undercut prevention layer 52A containing chemical species is not etched even when the metal-containing layer is etched, an undercut may not occur.

The undercut prevention layer 52A may further include an N-type or P-type impurity other than the chemical species.

Figure 4F:
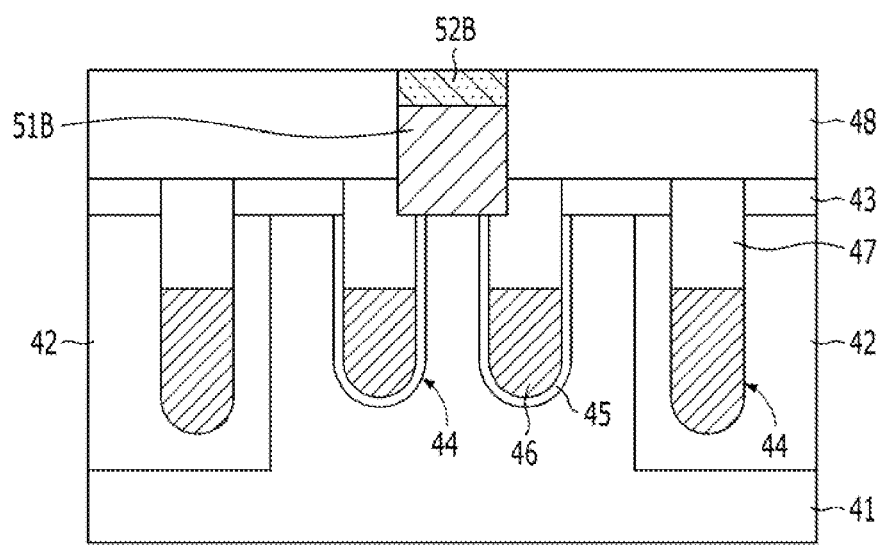

Referring to FIG. 4F, the undercut prevention layer 52A is selectively removed to leave a preliminary undercut prevention layer pattern 52B over the silicon-containing layer pattern 51B. Accordingly, the undercut prevention layer is not left over the interlayer dielectric layer 48.

The silicon-containing layer pattern 51B and the preliminary undercut prevention layer pattern 52B become a preliminary plug to fill the bit line contact hole.

Now shown in drawings, the preliminary plug may be formed by other processes. For example, the silicon-containing layer pattern 51B is formed to fill the bit line contact hole 50, and the chemical species are injected an upper part of the silicon-containing layer pattern 51B to form an undercut prevention layer pattern 52B.

Figure 4G:
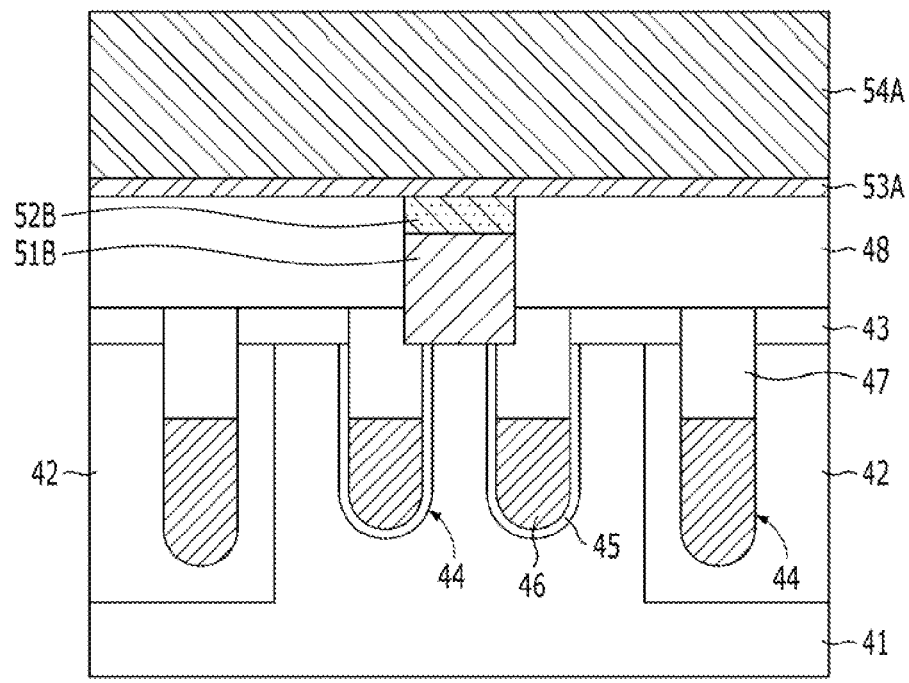

Referring to FIG. 4G, a diffusion barrier layer 53A is formed over the preliminary undercut prevention layer pattern 52B and the interlayer dielectric layer 48.

A metal layer 54A is formed over the diffusion barrier layer 53A. The diffusion barrier layer 53A and the metal layer 54A may include a metal, a metal nitride, a metal silicide, and a metal silicon nitride. The diffusion barrier layer 53A and the metal layer 54A may include a stacked layer of two or more selected from a metal, a metal nitride, a metal silicide, and a metal silicon nitride. Also, the diffusion barrier layer 53A and the metal layer 54A may include a tungsten-containing material. For example, the diffusion barrier layer 53A and the metal layer 54A may be formed by stacking tungsten silicide, tungsten nitride, and tungsten. Furthermore, the diffusion barrier layer 53A and the metal layer 54A may be formed by stacking tungsten silicide, tungsten silicon nitride, and tungsten. In this case, tungsten silicide, tungsten nitride, and tungsten silicon nitride may be used as the diffusion barrier layer 53A.

Through the above-described series of processes, a bit line stack is formed, in which the silicon-containing layer pattern 51B, the preliminary undercut prevention layer pattern 52B, the diffusion barrier layer 53A, and the metal layer 54A are formed.

Figure 4H:
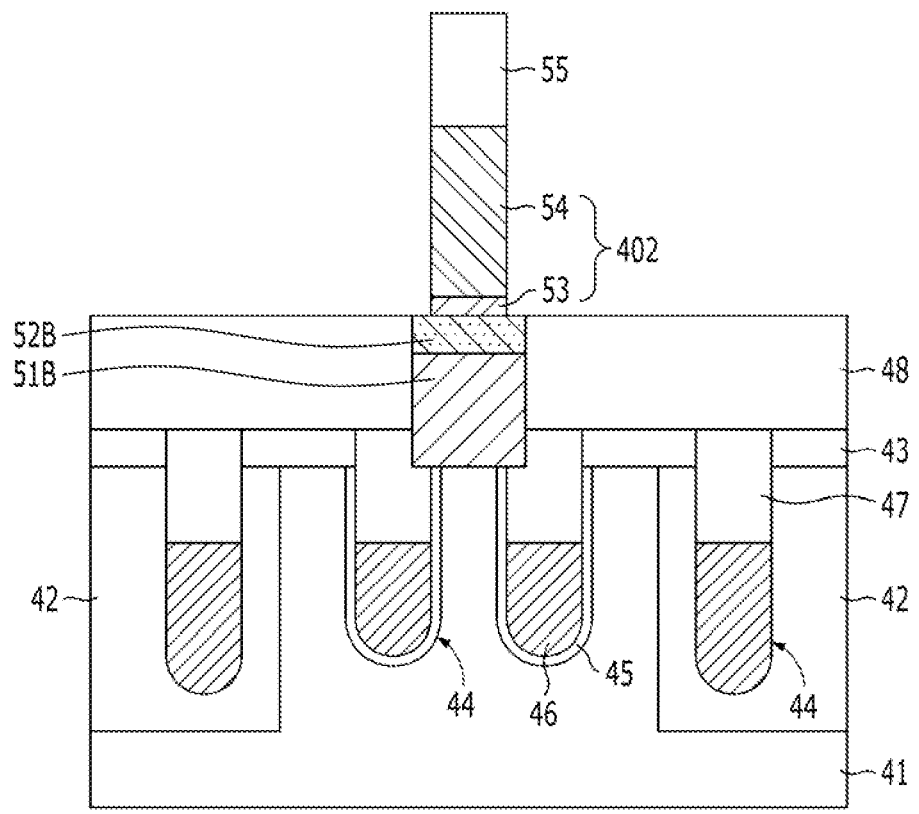

Referring to FIG. 4H, a second mask pattern 55 is formed. The second mask pattern 55 may be formed of photoresist. Furthermore, the second mask pattern 55 may include a patterned hard mask layer. The hard mask layer may include an insulation layer such as oxide or nitride.

Using the second mask pattern 55 as an etch mask, bit line patterning is performed. For example, the metal layer 54A and the diffusion barrier layer 53A are etched. Accordingly, a bit line 402 is formed. The bit line 402 includes a diffusion barrier layer pattern 53 and a metal layer pattern 54. The etch process for the metal layer 54A and the diffusion barrier layer 53A may include dry etch such as RIE. If the metal layer 54A and the diffusion barrier layer 53A are tungsten-based layers, the etch process may be performed using $SF_6$, $Cl_2$, or a mixture thereof. In addition to $SF_6$, a fluorine-based gas such as $NF_3$, $F_2$, HF or the like may be used. Furthermore, gases such as $N_2$ and $O_2$ may be further added during the etch process. As the above-described gases are used to etch the metal layer 54A and the diffusion barrier layer 53A, a vertical profile is formed. When the diffusion barrier layer 53A and the tungsten-based metal layer 54A are etched, a fluorine-based gas may be used as the main etching gas. Typically, the dry etch process includes a main etch process and an over etch process. The over etch process performed after the main etch process is performed in such a manner that residues of the etched material do not occur over the lower material.

During the above-described etch process, the etch rate of the metal-containing material is different from the etch rate of the silicon-containing material. For example, the silicon-containing layer pattern 51B has a larger etch rate than the metal layer 54A and the diffusion barrier layer 53A. Therefore, an undercut may occur in the upper part of the silicon-containing layer pattern 51B. In this embodiment of the present invention, the preliminary undercut prevention layer pattern 52B containing the chemical species for reducing an etch rate to prevent an undercut is formed to reduce the etch rate in the upper part of the silicon-containing layer pattern 51B. Accordingly, during the etch process for the metal layer 54A and the diffusion barrier layer 53A, an undercut may not occur in the preliminary undercut prevention layer pattern 52B where an undercut is likely to occur. Furthermore, although an over etch process is sufficiently performed, an undercut may not occur. An undercut may occur in the material such as tungsten silicide among the materials used as the diffusion barrier layer 53A. However, in this embodiment of the present invention, the preliminary undercut prevention layer pattern 52B is formed to prevent a loss of tungsten silicide.

Figure 4I:
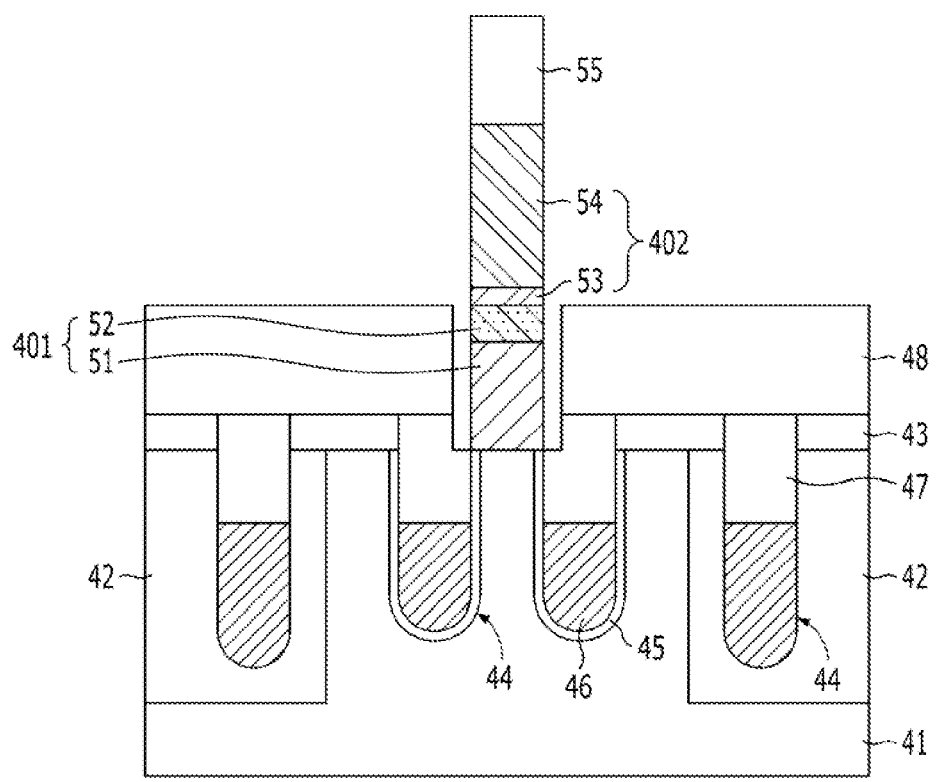

Referring to FIG. 4I, the preliminary undercut prevention layer pattern 52B and the silicon-containing layer pattern 51B are etched by using the second mask pattern 55 as an etch mask. Accordingly, a bit line contact plug 40 is formed. The bit line contact plug 401 includes a silicon plug 51 and an undercut prevention layer pattern 52. Therefore, the upper part of the bit line contact plug 401 may include the undercut prevention layer pattern 52 formed therein. The etch process for the preliminary undercut prevention layer pattern 52B and the silicon-containing layer pattern 51B may include a dry etch process such as RIE. For example, the etch process may be performed using $SF_6$, HBr, $Cl_2$, or a mixture thereof. In addition to $SF_6$, a fluorine-based gas such as $NF_3$, $F_2$, HF or the like may be used. Furthermore, gases such as $N_2$ and $O_2$ may be further added during the etch process. As the above-described gases are used to etch the preliminary undercut prevention layer pattern 52B and the silicon-containing layer pattern 51B, a vertical profile is formed. Since the preliminary undercut prevention layer pattern 52B and the silicon-containing layer pattern 51B include polysilicon, HBr may be used as the main etching gas. Typically, the dry etch process includes a main etch process and an over etch process. The over etch process performed after the main etch process is performed in such a manner that residues of the etched material do not occur over the lower material.

During the etch process for the silicon-containing layer pattern 51B, an undercut may occur in the upper part of the silicon-containing layer pattern 51B. In this embodiment of the present invention, the undercut prevention layer pattern 52 containing the chemical species for reducing an etch rate to prevent an undercut is formed over the silicon plug 51 to reduce the etch rate. Accordingly, although an over etch process is sufficiently performed, an undercut may not occur. During the over etch process for the silicon plug 51, an undercut may occur in the material such as tungsten silicide among the materials used as the diffusion barrier layer 53. However, in this embodiment of the present invention, the undercut prevention layer pattern 52 is formed to prevent a loss of tungsten silicide.

Subsequently, the second mask pattern 55 is removed. When the second mask pattern 55 includes a hard mask layer, the second mask pattern 55 may be left. Then, a bit line spacer may be formed on the sidewalls of the bit line contact plug and the bit line.

In the third embodiment of the present invention, the GBL etch process has been described. The GBL etch process refers to an etch process for forming a gate of a peripheral area and a bit line of a cell area at the same time. The bit line formed in the cell area may have an inner GBL (IGBL) structure. The GBL etch process is to equalize the critical dimensions (CD) of a bit line contact plug and a bit line. In this case, a bit line contact hole has a smaller CD than the bit lines contact plug and the bit line. Accordingly, it may be possible to secure an overlay margin with a subsequent storage node contact (SNC).

In accordance with the embodiments of the present invention, as the undercut prevention layer into which the chemical species such as carbon or nitrogen are injected is previously formed in an area of the silicon-containing layer where an undercut is likely to occur, it may be possible to prevent an undercut during the etch process for the subsequent metal-containing layer. Since an undercut does not occur, a vertical profile may be formed. Furthermore, since the area of the silicon-containing layer is not reduced, it may be possible to prevent an increase in resistance of the semiconductor structure.

Furthermore, as the tungsten-based material is used to form a metal-containing layer, the thickness of the semiconductor structure may be reduced to implement low resistance, and parasitic capacitance may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a silicon-containing layer;
   forming an undercut prevention layer over the silicon-containing layer;
   forming a diffusion barrier layer over the undercut prevention layer;
   forming a metal layer over the diffusion barrier layer;
   etching the metal layer and the diffusion barrier layer; and
   forming a conductive structure by etching the metal layer, the diffusion barrier layer, the undercut prevention layer and the silicon-containing layer,
   wherein the metal layer includes tungsten silicide, tungsten nitride, tungsten or a combination thereof,
   wherein the diffusion barrier layer includes tungsten silicide, tungsten nitride, tungsten silicon nitride or a combination thereof,
   wherein the forming of the undercut prevention layer comprises injecting chemical species for controlling an etch rate,
   wherein the injecting of the chemical species comprises implanting of carbon, and
   wherein the conductive structure comprises a gate electrode or bit line.

2. The method of claim 1, wherein the injecting of the chemical species comprises in-situ doping of carbon when the undercut prevention layer is formed.

3. The method of claim 1, wherein a first polysilicon layer is formed as the silicon-containing layer, and a second polysilicon layer containing of carbon is formed as the undercut prevention layer.

4. The method of claim 3, wherein the first and second polysilicon layers comprise a doped polysilicon layer with N-type or P-type impurities.

5. The method of claim 3, wherein the first polysilicon layer is formed with an undoped polysilicon layer, and the second polysilicon layer is formed with a doped polysilicon layer with N-type or P-type impurities.

6. The method of claim 1, wherein a polysilicon layer is formed as the silicon-containing layer, and the undercut prevention layer is formed by injecting of carbon into an upper part of the polysilicon layer.

7. The method of claim 1, wherein the undercut prevention layer comprises a polysilicon layer doped with N-type or P-type impurities.

8. The method of claim 1, wherein the metal-containing layer comprises a tungsten-based material.

* * * * *